(12) United States Patent
Ikuta et al.

(10) Patent No.: US 6,475,575 B1
(45) Date of Patent: Nov. 5, 2002

(54) PELLICLE AND METHOD FOR MANUFACTURE THEREOF

(75) Inventors: Yoshiaki Ikuta, Kanagawa (JP); Shinya Kikugawa, Kanagawa (JP); Hitoshi Mishiro, Ibaraki (JP); Hiroshi Arishima, Tokyo (JP); Kaname Okada, Kanagawa (JP); Katsuhiro Matsumoto, Kanagawa (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 09/831,360

(22) PCT Filed: Sep. 13, 2000

(86) PCT No.: PCT/JP00/06286

§ 371 (c)(1),
(2), (4) Date: Aug. 6, 2001

(87) PCT Pub. No.: WO01/20401

PCT Pub. Date: Mar. 22, 2001

(30) Foreign Application Priority Data

Sep. 13, 1999 (JP) .............................. 11-259161
Nov. 19, 1999 (JP) .............................. 11-330120
Apr. 28, 2000 (JP) ............................. 2000-131268
Jun. 7, 2000 (JP) ............................. 2000-170770

(51) Int. Cl.[7] ................................................. A47G 1/12
(52) U.S. Cl. ............................................. 428/14; 430/5
(58) Field of Search .............................. 428/14; 430/5; 501/54

(56) References Cited

U.S. PATENT DOCUMENTS

| | | | | |
|---|---|---|---|---|
| 5,326,729 A | * | 7/1994 | Yaba et al. | 501/54 |
| 5,772,817 A | * | 6/1998 | Yen et al. | 156/73.1 |
| 5,820,950 A | * | 10/1998 | Wang | 428/14 |
| 6,190,743 B1 | * | 2/2001 | Wang | 428/14 |

FOREIGN PATENT DOCUMENTS

| | | | |
|---|---|---|---|
| JP | 63-6553 | 1/1988 | |
| JP | 402081046 A | * 3/1990 | 430/5 |
| JP | 3-276154 | 12/1991 | |

* cited by examiner

*Primary Examiner*—Harold Pyon
*Assistant Examiner*—Jane Rhee
(74) *Attorney, Agent, or Firm*—Oblon, Spivak, McClelland, Maier & Neustadt, P.C.

(57) ABSTRACT

It is characterized by having a pellicle sheet made of a synthetic quartz glass having an OH group concentration of at most 100 ppm and containing substantially no oxygen deficient defect. It is particularly preferred that the OH group concentration is at most 10 ppm, and the internal transmittance is at least 80%/cm at a wavelength of 157 nm.

15 Claims, 8 Drawing Sheets a:b=1:2~1:8

PELLICLE AND METHOD FOR MANUFACTURE THEREOF

TECHNICAL FIELD

The present invention relates to a pellicle to be mounted on a mask or reticle (hereinafter both will be referred to as a mask) used in production process of integrated circuits with a purpose of preventing attachment of foreign substances, and its production method.

BACKGROUND ART

The patterning is carried out by exposing a semiconductor wafer having a resist material coated thereon in photolithography to be used in a process of producing integrated circuits. If e.g. scars or foreign substances are present on a mask to be used, the scars or foreign substances are printed on the wafer together with the pattern, thus causing short circuit or breakage of wire. Accordingly, a method of mounting a pellicle on one side or both sides of the mask as a foreign substances guard on the surface of the mask, has been employed. In the present specification, a pellicle comprises a flat pellicle sheet and a pellicle frame having a predetermined thickness so as to isolate the pellicle sheet from the mask, and has a shape of a container by attaching the pellicle sheet on the upside of the pellicle frame.

Conventionally, as a pellicle, one having an outline as illustrated by a front view and a side view in FIG. 1, comprising a pellicle frame 1 made of e.g. aluminum and a pellicle membrane 2 (corresponding to the above pellicle sheet) made of nitrocellulose or a fluororesin and having a thickness of from several nm to several μm bonded to the pellicle frame by means of an adhesive 3, is used, and this is fixed on a mask so that a pattern on the mask is covered, as disclosed in JP-A-63-15250 or JP-A-3-39963.

Along with high-integration of LSI in recent years, a technique to draw circuit patterns with thinner lines has been required in photolithography, and accordingly use of an exposure light source emitting light having a shorter wavelength has been promoted. For example, for a light source of a stepper for photolithography, a light source emitting light having a shorter wavelength such as a KrF excimer laser (wavelength 248 nm), a ArF excimer laser (wavelength 193 nm) or a $F_2$ laser (wavelength 157 nm) becomes used, in addition to conventional g-line (wavelength 436 nm) and I-line (wavelength 365 nm).

As pellicle membrane material resistant to such a short-wavelength light source, a fluorine-containing polymer having a relatively low absorption in the ultraviolet region, such as CYTOP (tradename, manufactured by Asahi Glass Company, Limited) which is a commercially available fluorine-containing resin or Flon AF (tradename, manufactured by Du Pont Kabushiki Kaisha) which is a fluorine-containing resin, has been known. However, such a fluorine-containing polymer shows practical light transmittance and durability to light when the exposure light source is a KrF excimer laser or a ArF excimer laser, but it has inadequate light transmittance and undergoes decomposition by laser irradiation when the exposure light source is a $F_2$ laser.

On the other hand, as a material transmitting I-line and g-line, a synthetic quartz glass has been known, and JP-A-8-160597 proposes to attach a synthetic quartz glass sheet as a pellicle sheet to a pellicle frame and to use the assembly as a pellicle.

However, studies by the present inventors have clarified that there are several problems when a synthetic quartz glass is used as a material of the pellicle sheet.

A first problem is that a pellicle sheet made of a synthetic quartz glass has a certain degree of thickness, whereby it has to have a high light transmittance depending upon the thickness.

Further, a second problem is as follows.

Conventionally, as a pellicle membrane, a polymer membrane which is slightly larger than the pellicle frame is prepared by spin coating, this membrane is bonded to an opening of the pellicle membrane by means of e.g. an epoxy type adhesive, and a surplus portion is cut off to produce a pellicle.

On the other hand, in a case where a synthetic quartz glass is used as the pellicle sheet, it is necessary to prepare a synthetic quartz glass sheet having its size adjusted to the size of an opening of the pellicle frame by cutting.

As a method of cutting a glass sheet of e.g. synthetic quartz glass, a method of applying a cutting line on the surface of the glass sheet while supplying a glass cutting oil thereto and splitting the glass along the cutting line, may be mentioned. In this method, cracks may form along the cutting line and the cut surface or microfragment (hereinafter sometimes referred to as cullet) may peel off during splitting of the glass sheet.

In order to avoid attachment of swarf or cullet generated from the cut surface on the glass sheet after cutting the glass sheet, the glass sheet surface may be covered with e.g. a paper sheet, or the glass sheet surface may be cleaned after cutting, however, it is difficult to obtain a glass sheet having no cullet or the like attached thereto by these means, because cullet will be generated from the cracks on the cut surface even after cleaning. Further, the cracks may cause fracture when an impact is applied thereto due to subsequent handling.

Further, a third problem is as follows.

If there is a dispersion of the thickness of the pellicle sheet on the plane, the light path of refracted light changes, whereby the position of a transcription pattern shifts, and accordingly no acceptable lithography an be carried out. In FIG. 2 is conceptually shown this state, wherein an exposure beam 305 being transmitted through a pellicle sheet 304 having an inclined surface is refracted in a direction indicated by the arrow.

On the other hand, a synthetic quartz glass sheet is processed by slicing a shaped synthetic quartz glass block. A pellicle sheet is required to have no scar on the surface to be an obstacle to exposure, and in order to use the synthetic quartz glass sheet as a pellicle sheet, it is required to polish the synthetic quartz glass sheet after slicing and process it into a predetermined thickness. This polishing is usually carried out by means of a double surface polishing apparatus.

The processing of the pellicle sheet comprises a lapping step as rough grinding and a polishing step as mirror finish, and a double surface polishing apparatus is used in both steps. As the double surface polishing apparatus, a polishing apparatus as illustrated in a partial side view of FIG. 3 and in a partial oblique view of FIG. 4 has been known. This polishing apparatus comprises a bottom wheel 306 and an upper wheel 307, and is used for polishing by the surface of e.g. cast iron itself in the lapping step and by means of the polishing cloth in the polishing step.

Further, gears are formed on the periphery of a carrier 308 as a work holder. Between a solar gear 309 and an internal gear 310 in the main body of the apparatus, the carrier 308 is set, and the upper and bottom wheels or one of the two wheels is rotated so that the carrier 308 revolves, and both surfaces of a work piece 311 can be polished simultaneously. Here, a supply port of an abrasive material is provided on the upper wheel side, although not shown in the figure, to supply an abrasive material to the work piece 311 during polishing.

However, in the case of processing by means of such an apparatus, the polishing amount per unit time hardly be uniform as between the periphery and the center portion of the work piece, and it tends to be difficult to supply the abrasive material so that it uniformly acts on the plane of the work piece, and accordingly it tends to be difficult to uniformly polish the plane of the work piece.

Further, a fourth problem is as follows.

Namely, in JP-A-8-160597, the thickness of the pellicle sheet is preferably from 0.01 to 0.5 mm, however, if the synthetic quartz glass is processed into this thickness, there are significant problems in fracture and breakage during processing or during its use.

It is an object of the present invention to provide a pellicle and its production method to overcome the above problems.

DISCLOSURE OF THE INVENTION

The present invention provides a pellicle which comprises a pellicle frame and a pellicle sheet made of a synthetic quartz glass, attached to an opening of the pellicle frame, wherein the pellicle sheet is made of a synthetic quartz glass having a OH group concentration of at most 100 ppm and containing substantially no oxygen deficient defect. Particularly, the present invention provides the above pellicle, wherein the pellicle sheet is made of a synthetic quartz glass having a OH group concentration of at most 10 ppm, containing substantially no oxygen deficient defect and having an internal transmittance of at least 80%/cm at a wavelength of 157 nm.

According to Embodiment 1 of the present invention, the above pellicle wherein the pellicle sheet has a centerline average surface roughness $R_a$ of at most 0.5 µm on the side face in an area within 10 µm from the surface, is provided. Further, the above pellicle wherein the dispersion of the sheet thickness of the pellicle sheet is within ±0.3 µm/150 mm, is provided.

Further, the above pellicle wherein the pellicle sheet is attached to the pellicle frame so that the outline of the pellicle frame extends beyond the outline of the pellicle sheet, and the width of the extension is from 0.05 to 1 mm, is provided.

Still further, a method for producing a pellicle comprising a pellicle frame and a pellicle sheet made of a synthetic quartz glass, attached to an opening of the pellicle frame, which comprises a step of polishing a synthetic quartz glass sheet having an outline dimension larger than the dimension of the pellicle frame by at least 5 mm, and cutting the synthetic quartz glass sheet into a predetermined dimension to produce the pellicle sheet, and a method for producing a pellicle comprising a pellicle frame and a pellicle sheet made of a synthetic quartz glass, attached to an opening of the pellicle frame, which comprises a step of polishing a synthetic quartz glass sheet in such a state that a dummy portion to be processed is attached to the periphery of the synthetic quartz glass sheet to produce the pellicle sheet, are provided.

BEST MODE FOR CARRYING OUT THE INVENTION

Figure 1:
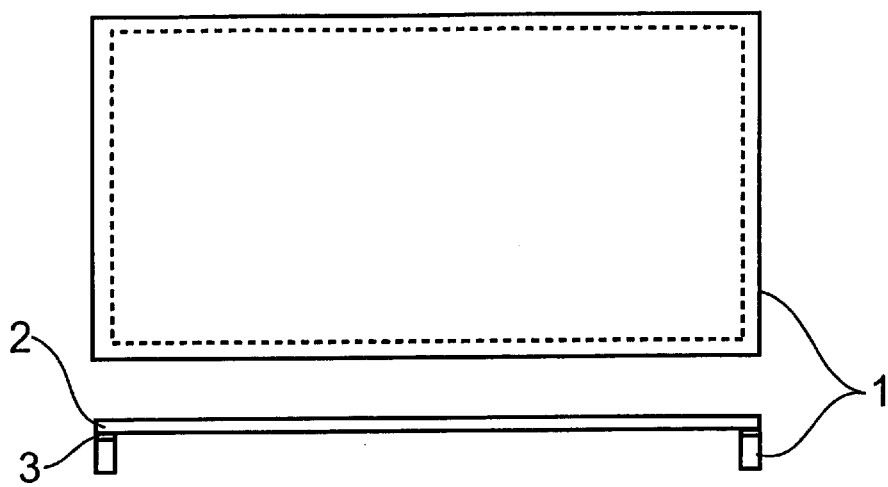
FIG. 1: a front view and a side view illustrating a pellicle.
Figure 2:
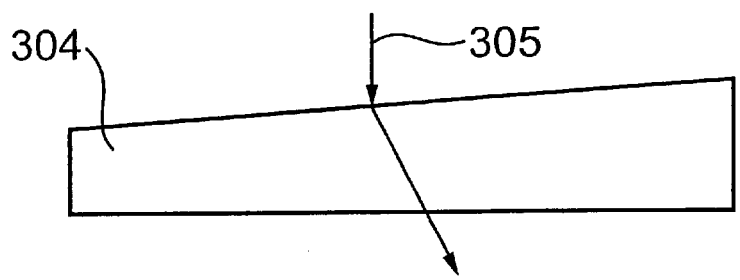
FIG. 2: a conceptual view illustrating the shift of an exposure light ray due to dispersion of sheet thickness.
Figure 3:
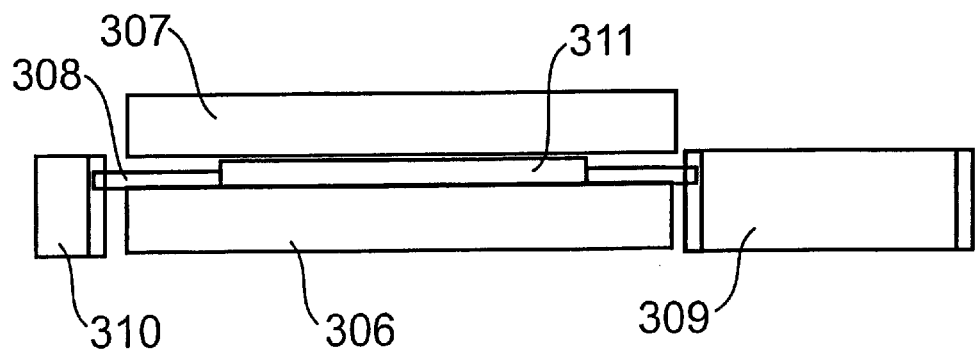
FIG. 3: a partial side view illustrating a double surface polishing apparatus.
Figure 4:
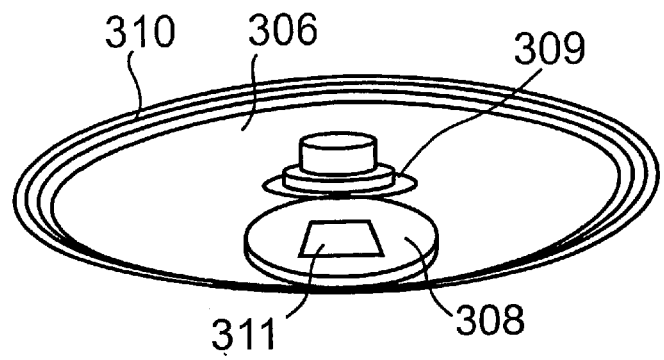
FIG. 4: a partial oblique view illustrating a double surface polishing apparatus.

A means to overcome the first problem will be explained.

It is important that the OH group concentration in the synthetic quartz glass is at most 100 ppm, and the OH group concentration is preferably at most 10 ppm particularly in a case where it is used for an optical component of an apparatus employing as a light source a light in the vacuum ultraviolet region having a wavelength of at most 180 nm. The lower the OH group concentration, the higher transmittance can be obtained. The internal transmittance at a wavelength of 157 nm is at least 80%/cm to use the synthetic quartz glass as a pellicle sheet without any problem practically, and such an internal transmittance is preferred as the pellicle sheet.

Further, an oxygen deficient defect ($\equiv$Si—Si$\equiv$bond) in the synthetic quartz glass causes formation of 214 nm absorption band ($\equiv$Si•) due to reaction $\equiv$Si—Si$\equiv$+ hv$\rightarrow$$\equiv$Si•+$\equiv$Si• when irradiated with ultraviolet light, and decreases the transmittance of ultraviolet light at a wavelength of from 150 to 200 nm. Accordingly, in the present invention, the synthetic quartz glass contains substantially no oxygen deficient defect. Here, "containing substantially no oxygen deficient defect" specifically means that the number of the oxygen deficient defects in the synthetic quartz glass is less than $1\times10^{15}$ defects/cm$^3$. The concentration of the oxygen deficient defect can be obtained by the absorption intensity at a wavelength of 163 nm (Phys. Rev., B38, 12772 (1988)).

Further, in the present invention, metal impurities (such as alkali metals, alkaline earth metals and transition metals)

and chlorine in the synthetic quartz glass not only decrease the transmittance within the vacuum ultraviolet region to the ultraviolet region but also causes decrease in durability to ultraviolet light, and accordingly their content is preferably low. The content of the total metal impurities is preferably at most 100 ppb, particularly preferably at most 10 ppb. The chlorine concentration is preferably at most 100 ppm, particularly preferably at most 10 ppm, furthermore preferably at most 2 ppm.

The synthetic quartz glass of the present invention may be produced by e.g. a direct method, a soot method (VAD method or OVD method), a sol-gel method or a plasma method. Particularly preferred is a soot method since the OH group concentration in the synthetic quartz glass can relatively easily be controlled, and contamination of impurities such as chlorine and metals can be avoided since the temperature during synthesis is low.

In the case of producing the synthetic quartz glass by a direct method or a soot method, the glass forming material is not particularly limited so long as it can be gasified, and silicon halide compounds including chlorides such as $SiCl_4$, $SiHCl_3$ and $SiH_2Cl_2$, fluorides such as $SiF_4$, $SiHF_3$ and $SiH_2F_2$, bromides such as $SiBr_4$ and $SiHBr_3$ and iodides such as $SiI4$, and alkoxysilanes represented by $R_nSi(OR)_{4-n}$ (wherein R is a $C_{1-4}$ alkyl group and n is an integer of from 0 to 3), may be mentioned. Particularly preferred is an alkoxysilane containing no chlorine. Further, as a substrate on which the above glass forming material is deposited as glass or a porous material, a seed stick made of quartz glass (e.g. seed stick as disclosed in JP-B-63-24973) may be used. Further, the shape is not limited to a stick, and a sheet substrate may be used.

Now, Examples will be explained below. Examples 1 and 2 correspond to Working Examples and the other correspond to Comparative Examples.

EXAMPLE 1

Fine quartz glass particles formed by subjecting silicon tetrachloride to flame hydrolysis by a known method, were deposited and grown on a substrate, to prepare a porous quartz glass body. The obtained porous quartz glass body was put in an electric furnace capable of controlling the atmosphere, the temperature was raised to 1200° C. while keeping a reduced pressure of at most 1 Torr, and the glass body was held at this temperature for 20 hours, and then the temperature was further raised to 1450° C. and the glass body was held at this temperature for 10 hours, to obtain a transparent quartz glass body (200 mmφ×450 mm).

The obtained transparent quartz glass body was heated to 1750° C. and molded into 130×110 mm, then sliced into a thickness of 1 mm, to obtain a synthetic quartz glass sheet of 130×110×1 mm.

Further, the obtained synthetic quartz glass sheet was ground and polished by diamond and cerium oxide to prepare a synthetic quartz glass thin sheet of 130×110×0.5 mm for a pellicle. The synthetic quartz glass pellicle sheet thus obtained had a OH group concentration of 15 ppm and an oxygen deficient defect concentration of less than $1\times10^{15}$ defects/cm$^3$.

EXAMPLE 2

A synthetic quartz glass thin sheet for a pellicle was prepared in the same manner as in Example 1 except that the porous quartz glass was put in the electric furnace capable of controlling the atmosphere and held at room temperature in a $SiF_4/He=10/90$ (volume ratio) atmosphere under 1 atm for 10 hours, then the temperature was raised to 1450° C. in a 100% helium gas atmosphere under 1 atm, and the glass was held at this temperature for 10 hours to obtain a transparent quartz glass body. The synthetic quartz glass pellicle sheet thus obtained had a OH group concentration of 3.6 ppm and an oxygen deficient defect concentration of less than $1\times10^{15}$ defects/cm$^3$.

EXAMPLE 3

A synthetic quartz glass thin sheet for a pellicle was prepared in the same manner as in Example 1 except that the porous quartz glass was put in the electric furnace capable of controlling the atmosphere, the temperature was raised to 1450° C. in a 100% helium gas atmosphere under 1 atm, and the glass was held at this temperature for 10 hours to obtain a transparent quartz glass body. The synthetic quartz glass pellicle sheet thus obtained had a OH group concentration of 146 ppm and an oxygen deficient defect concentration of less than $1\times10^{15}$ defects/cm$^3$.

EXAMPLE 4

A synthetic quartz glass thin sheet for a pellicle was prepared in the same manner as in Example 1 except that the porous quartz glass was put in the electric furnace capable of controlling the atmosphere, the temperature was raised to 1450° .C in a 100% hydrogen gas atmosphere under 1 atm, and the glass was held at this temperature for 10 hours to obtain a transparent quartz glass body. The synthetic quartz glass pellicle sheet thus obtained had a OH group concentration of 2.3 ppm and an oxygen deficient defect concentration of $5\times10^{15}$ defects/cm$^3$.

EXAMPLE 5

Using "CYTOP" (tradename, manufactured by Asahi Glass Company, Limited) which is a fluororesin having a cyclic structure in its main chain, a smooth membrane having a thickness of 1 μm for a pellicle was prepared by a spin coater to obtain a pellicle membrane.

Evaluations

With respect to the obtained synthetic quartz glass thin sheets and the membrane thus obtained, the following three evaluations were carried out regarding vacuum ultraviolet transmittance and the durability to ultraviolet light. The evaluation results are shown in Table 1.

Evaluation 1: The internal transmittance at a wavelength of 157 nm was measured by means of a vacuum ultraviolet spectrophotometer.

Evaluation 2: Irradiation with $F_2$ laser light with an energy density of 0.5 mJ/cm$^2$/pulse for $1\times10^7$ pulses was carried out to evaluate change in appearance and change in the internal transmittance at a wavelength of 157 nm as between before and after the irradiation. The difference in the internal transmittance as between before and after the irradiation is preferably less than 0.1%/cm.

Evaluation 3: Irradiation with ArF excimer laser light with an energy density of 10 mJ/cm$^2$/pulse for $1\times10^7$ pulses was carried out to evaluate change in appearance and change in the internal transmittance at a wavelength of 193 nm as between before and after the irradiation. The difference in the internal transmittance as between before and after the irradiation is preferably less than 0.1%/cm.

From Table 1, it is evident that the pellicle sheets of Examples 1 and 2 have excellent light transmittances, and the light transmittances do not substantially decrease even if the sheets are irradiated with ultraviolet light having a wavelength at a level of at most 200 nm.

TABLE 1

| | Evaluation 1 Internal transmittance at 157 nm (%/cm) | Evaluation 2 | | Evaluation 3 | |
|---|---|---|---|---|---|
| | | Difference in internal transmittance between before and after irradiation (%/cm) | Change in appearance | Difference in internal transmittance between before and after irradiation (%/cm) | Change in appearance |
| Ex. 1 | 84.9 | <0.1 | Nil | <0.1 | Nil |
| Ex. 2 | 86.2 | <0.1 | Nil | <0.1 | Nil |
| Ex. 3 | 77.9 | 0.5 | Nil | <0.1 | Nil |
| Ex. 4 | 51.8 | −13.2 | Nil | <0.1 | Nil |
| Ex. 5 | 65.2 | Measurement impossible | Membrane disappeared | 5.3 | Decrease in membrane thickness |

Now, an embodiment (Embodiment 2) to overcome the second problem will be explained below. By the pellicle according to this Embodiment, generation of cullet can be suppressed during its use, and drawbacks during exposure in photolithography can be minimized.

The pellicle sheet according to Embodiment 2 has a centerline average surface roughness $R_a$ of at most 0.5 μm on the side face in an area within 10 μm from the surface. This centerline average surface roughness $R_a$ functions as an index indicating the state of cutting. If it exceeds 0.5 μm, cullet is likely to be generated when the pellicle is used, and there is a fear of drawbacks during exposure in photolithography. Preferably, the centerline average surface roughness $R_a$ is at most 0.5 μm on the entire side face of the pellicle sheet.

The pellicle sheet according to Embodiment 2 can be prepared by polishing a synthetic quartz glass sheet which is slightly larger than the opening of the pellicle frame, and cutting it. into a predetermined size. The cutting is carried out preferably by laser fusing, because cullet is less likely to be generated from the cut surface by cutting the synthetic quartz glass sheet while melting its side face. In the laser fusing, it is preferred that a gas is flowed around the laser light to make a current of the gas so that cutoffs fly below the synthetic quartz glass sheet, to prevent attachment of the cutoffs on the synthetic quartz glass sheet. In the case where the synthetic quartz glass is cut by laser fusing, the surface roughness on the side face close to the surface on the side which is irradiated with laser tends to be great. Accordingly, the condition that the centerline average surface roughness $R_a$ is at most 0.5 μm has to be satisfied with respect to the centerline average surface roughness on the side face in an area within 10 μm from the surface on the side which is irradiated with laser.

Further, the pellicle sheet according to Embodiment 2 has a thickness of preferably at most 0.5 mm. If the thickness of the pellicle sheet exceeds this thickness, the centerline average roughness at the cut surface by laser fusing tends to be great, and there is a fear of cullet during its use resultingly. Practically, the thickness is preferably at least 0.1 mm, more preferably at least 0.25 mm, to secure the strength of the pellicle sheet.

Further, by using a pellicle mounter when a pellicle is mounted on a reticle, a load is applied to the upper portion of the pellicle, and accordingly there is a fear of fracture. In order to avoid this fear as far as possible, it is necessary to minimize cracks at the periphery of the pellicle sheet before a pellicle mounter is used.

In Embodiment 2, generation of cracks is suppressed by making the pellicle be less likely to be impacted from the periphery during pellicle handling. Accordingly, it is preferred that all-around outline of the pellicle frame extends beyond the all-around outline of the pellicle sheet, and the width of the extension is from 0.05 to 1 mm, particularly from 0.2 to 1 mm. If the width of the extension is less than 0.05 mm, there is a fear that impact from the periphery can not adequately be eased, and if the width of the extension is larger than 1 mm, there is a fear that pressing tends to be inadequate when the pellicle mounter is used, and the bonding of the pellicle to the reticle tends to be inadequate.

Further, in the pellicle according to Embodiment 2, the angle formed by the surface of the pellicle sheet on the pellicle frame side with the side face of the pellicle sheet is preferably from 45° to 80°, whereby generation of e.g. cracks can be suppressed even if the pellicle sheet is impacted from the periphery during handling.

In Embodiment 2, the synthetic quartz glass sheet to be used as a pellicle sheet can be attached to an opening of the pellicle frame by means of a conventional adhesive of e.g. an epoxy type.

Now, Embodiment 2 will be explained in further detail with reference to the following Examples.

Synthetic quartz glass sheets of 200 mm φ having different sheet thicknesses were cut by laser fusing into an external dimension of 120 mm×140 mm to obtain pellicle sheets of the present invention.

Figure 5:
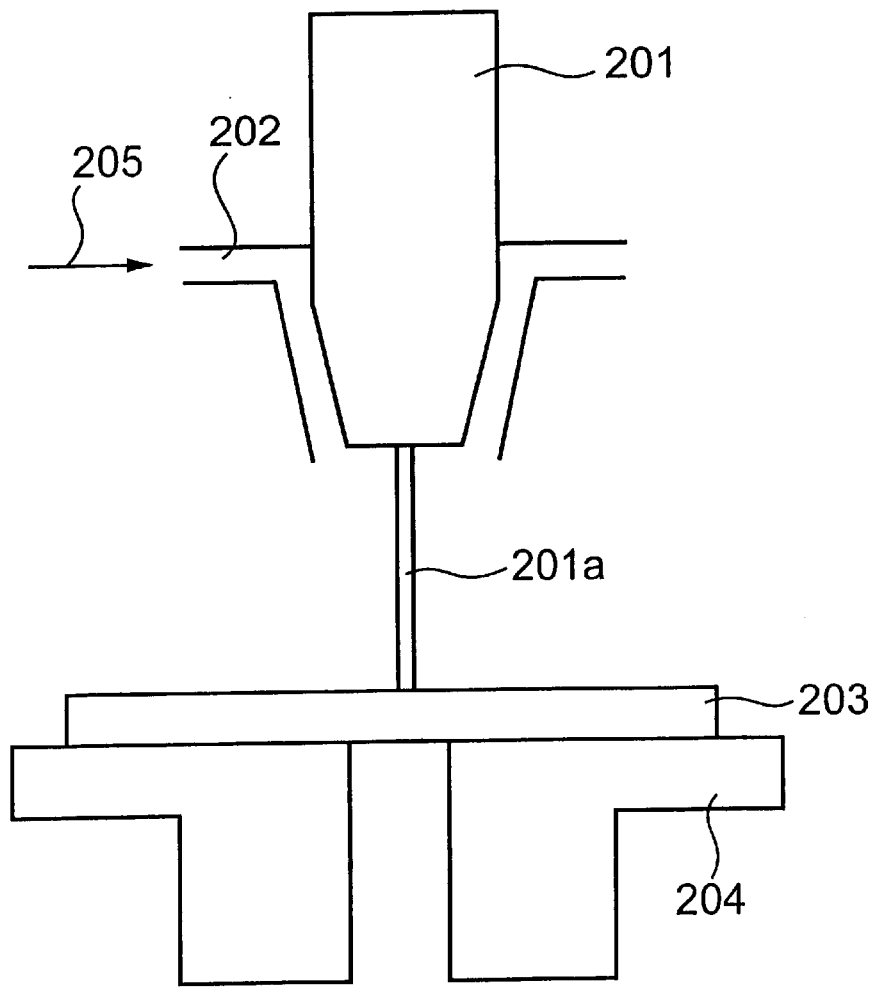
FIG. 5: a conceptual view illustrating laser cutting according to Embodiment 2.

For this laser fusing, $CO_2$ laser apparatus having a maximum output of 2000 W, as illustrated in FIG. 5, was used. A synthetic quartz glass sheet 203 on a holding stand 204 is irradiated with laser light 201a from a laser light generating apparatus 201, for cutting by laser fusing. During cutting, an assist gas 205 for blowing off cutoffs is introduced through an introduction tube 202 in a direction as indicated by the arrow and blows on the synthetic quartz glass sheet 203 to blow off cutoffs. The laser fusing was conducted by changing the output and the laser feed rate as identified in Table 2, while the spot size of the laser light 201a was about 100 μm.

Then, the centerline average surface roughness $R_a$ on the side face of the pellicle sheet in an area within 10 μm from the surface of the pellicle sheet was measured by means of SEM. The results are shown in column "$R_a$ at cut surface" in Table 2. Then, the synthetic quartz glass sheet as a pellicle sheet was bonded to an opening of a pellicle frame made of aluminum having an alumite treatment applied thereto by means of an ultraviolet-curing resin to prepare a pellicle.

With respect to this pellicle, in a clean box having a size of 50 cm×50 cm×50 cm and having a cleanness of 100, the number of particles in the inside of the clean box was measured by a particle counter while conducting air blow under a pressure of $4.9 \times 10^5$ $N/m^2$ (5 $kg/cm^2$) from over the pellicle sheet, and is shown in Table 2 as the number of particles in about 30 cm cube (1 cubic feet).

For comparison, cutting by an automatic glass cutter with which a sheet was split along the cutting line was also conducted.

TABLE 2

|  | Sheet thickness (μm) | Laser output (W) | Laser feed rate (mm/min) | $R_a$ at cut surface (μm) | Number of particles |
|---|---|---|---|---|---|
| Ex. 6 | 300 | 300 | 125 | 0.2 | 0 |
| Ex. 7 | 300 | 300 | 250 | 0.21 | 0 |
| Ex. 8 | 500 | 300 | 125 | 0.35 | 0 |
| Ex. 9 | 500 | 300 | 250 | 0.30 | 0 |
| Ex. 10 | 500 | 300 | 500 | 0.25 | 0 |
| Ex. 11 | 500 | 600 | 250 | 0.35 | 0 |
| Ex. 12 | 600 | 300 | 125 | 0.55 | 2 |
| Ex. 13 | 600 | 600 | 125 | 0.73 | 2 |
| Ex. 14 | 600 | 600 | 250 | 0.90 | 3 |
| Ex. 15 | 600 | 900 | 125 | 1.31 | 5 |
| Ex. 16 | 300 | Cutting by glass cutter | | 13.45 | 50 |
| Ex. 17 | 500 | Cutting by glass cutter | | 18.53 | 82 |
| Ex. 18 | 600 | Cutting by glass cutter | | 19.13 | 105 |

It is found from Table 2 that $R_a$ at the cut surface tends to be small when the laser feed rate is decreased, and tends to be large when the laser output is increased. In order to suppress $R_a$ at the cut surface to at most 0.5 μm, it is preferred to decrease the laser feed rate to preferably at most 250 mm/min, more preferably at most 125 mm/min, and to decrease the laser output to at most 600 W, more preferably at most 300 W.

Further, $R_a$ at the cut surface could be suppressed to at most 0.5 μm by making the sheet thickness at most 500 μm (i.e. 0.5 mm), and formation of particles could be confirmed with respect to one having $R_a$ at the cut surface exceeding 0.5 μm. This indicates that the sheet thickness of at most 0.5 mm is preferred to suppress particles. Further, with respect to one cut by a glass cutter, $R_a$ at the cut surface exceeded 0.5 μm, and generation of particles in the air blow was confirmed, regardless of the thickness of the synthetic quartz glass sheet for a pellicle.

Then, synthetic quartz glass sheets of 200 mmφ having a sheet thickness of 0.3 mm were cut into various dimensions by laser fusing to prepare pellicle sheets. Each pellicle sheet obtained by laser fusing was bonded to a pellicle frame having an outline of 120 mm×140 mm to prepare a pellicle, and presence or absence of cracks at the periphery of the pellicle sheet was observed by means of an optical microscope. As the pellicle frame, an aluminum frame having a thickness of 2 mm and an alumite treatment applied thereto was used. Here, the crack is one having a length of at least 1 μm. Further, this pellicle was mounted on a reticle by means of a pellicle mounter. The pressure of the pellicle mounter was 2.94×10⁶ N/m² (30 kg/cm²) or 4.9×10⁶ N/m² (50 kg/cm²).

The experiment was conducted with respect to ten pellicles and the results are shown in Table 3. The number of pellicles on which cracks were present before mounting on the reticle is shown in column "crack number". Further, the number of pellicles which undergo fracture when mounted on the reticle is shown in column "fracture number". The column "width of extension" means the width of extension of the outline of the pellicle frame relative to the outline of the pellicle sheet, and mounting pressure is a pressure of the pellicle mounter.

It is found from Table 3 that extension of the outline of the pellicle frame beyond the outline of the pellicle sheet is effective to prevent fracture during mounting.

TABLE 3

|  | Width of extension (mm) | Crack number | Mounting pressure (×10⁶ N/m²) | Fracture number |
|---|---|---|---|---|
| Ex. 19 | 0 | 3 | 4.9 | 2 |
| Ex. 20 | 0 | 1 | 2.94 | 1 |
| Ex. 21 | 0.1 | 0 | 4.9 | 0 |
| Ex. 22 | 0.1 | 0 | 2.94 | 0 |
| Ex. 23 | 0.25 | 0 | 4.9 | 0 |

Now, an embodiment (Embodiment 3) to overcome the third problem will be explained below.

The present inventors have conducted experiments on production of a pellicle sheet by a conventionally used double surface polishing apparatus, and as a result, found that the sheet thickness tends to be small at the periphery portion and be large at the center portion, and the portion at which the variation is large is restricted to the periphery, namely, such a droop that the periphery of the polished pellicle sheet alone becomes thin increases dispersion of the sheet thickness of the pellicle sheet. They have further found that there is a difference in polishing rate between the periphery and the center portion of a carrier, since the above tendency becomes small in the inside of the carrier. Embodiment 3 has been made on the basis of these discoveries.

Figure 6:
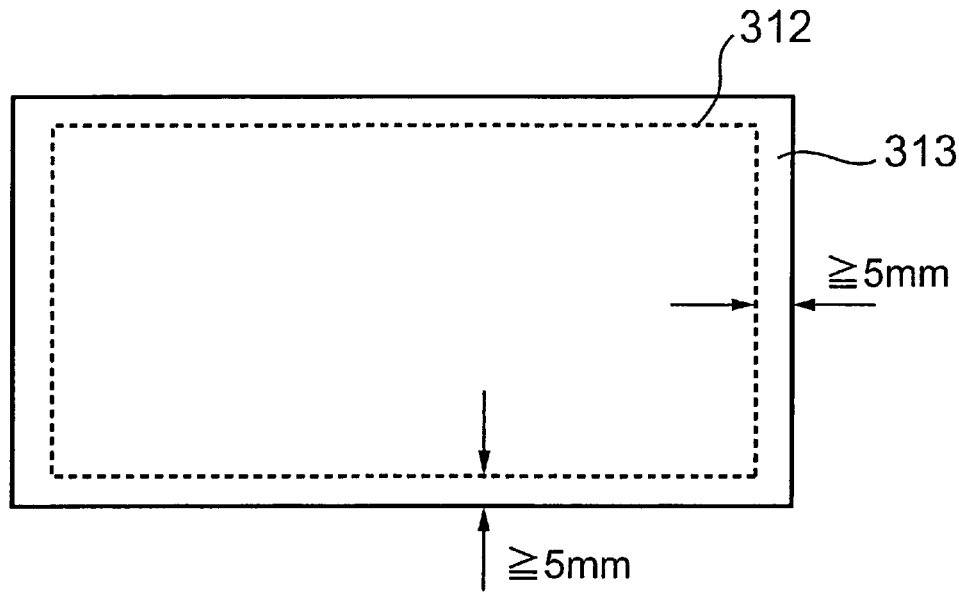
FIG. 6: a conceptual view illustrating a pellicle sheet according to Embodiment 3.
Figure 7:
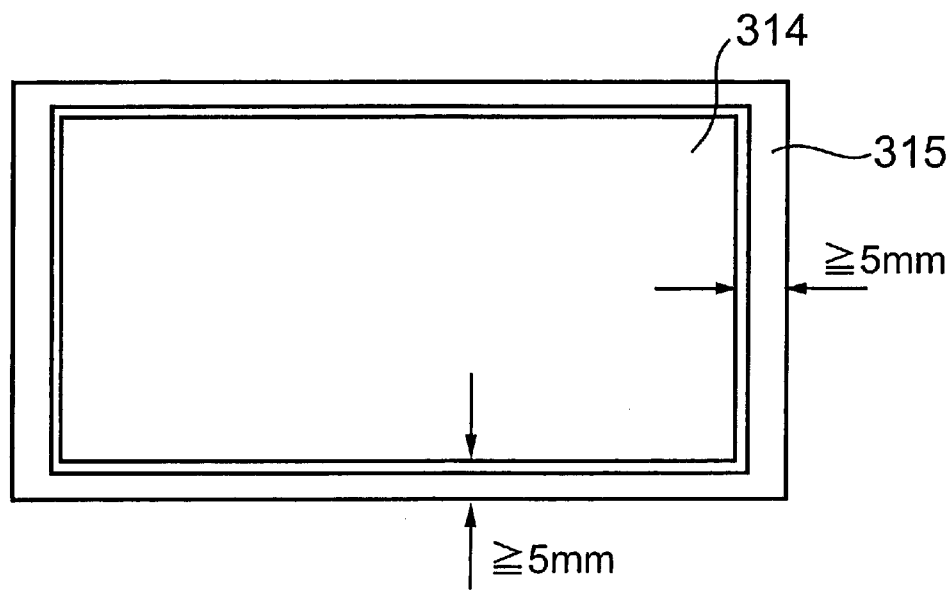
FIG. 7: a conceptual view illustrating the relation between a pellicle sheet and a dummy portion to be produced according to Embodiment 3.

In Embodiment 3, as shown in FIG. 6, a substrate which is larger than the outline dimension 312 to be used as a pellicle sheet by at least 5 mm, preferably 10 mm (hereinafter referred to as a base 313) is polished into a predetermined sheet thickness, and the periphery thereof is cut off, whereby a pellicle sheet having a good dispersion of sheet thickness can be obtained. Further, a dummy portion to be processed 315 having the same thickness as the pellicle sheet to be processed may be provided on the periphery of the pellicle sheet 314 as illustrated in FIG. 7, instead of the margin of cutting, and set to the carrier similarly to the pellicle sheet, to decrease the droop at the periphery.

Here, the width of the dummy portion to be processed 315 is preferably at least 5 mm, particularly preferably at least 10 mm. Further, the dummy portion to be processed 315 is preferably made of a synthetic quartz glass, since the polishing speed is the same as the pellicle sheet to be processed, and it can be possible to prevent the pellicle sheet from being damaged during processing by fine particles generated by the polishing, but it may be a resin satisfying the same properties.

In the case of polishing this base, the polishing apparatus preferably has such a size that one base 313 can be contained at least in the radius of the carrier, or such a size that the entire dummy portion to be processed 315 can be contained in the radius, whereby influence of the difference in polishing rate between the center portion and the periphery of the carrier can be minimized.

Figure 8:
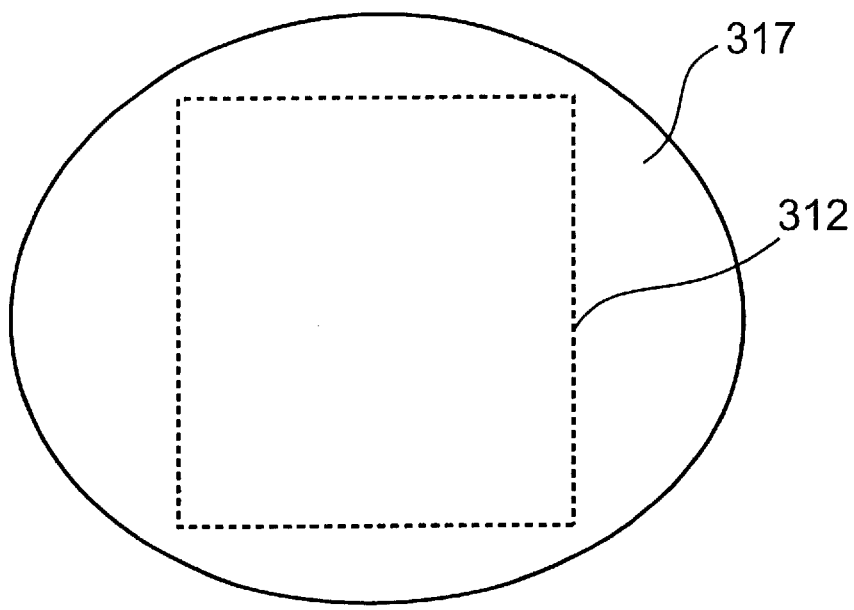
FIG. 8: a conceptual view illustrating the relation between a pellicle sheet and a circular base according to Embodiment 3.

Further, as shown in FIG. 8, when the base 317 has a circular shape, the base is not fixed in the carrier and can move freely in the hole of the carrier during polishing, whereby the difference in polishing rate between the periphery and the inner circle portion of the carrier can be minimized.

Figure 9:
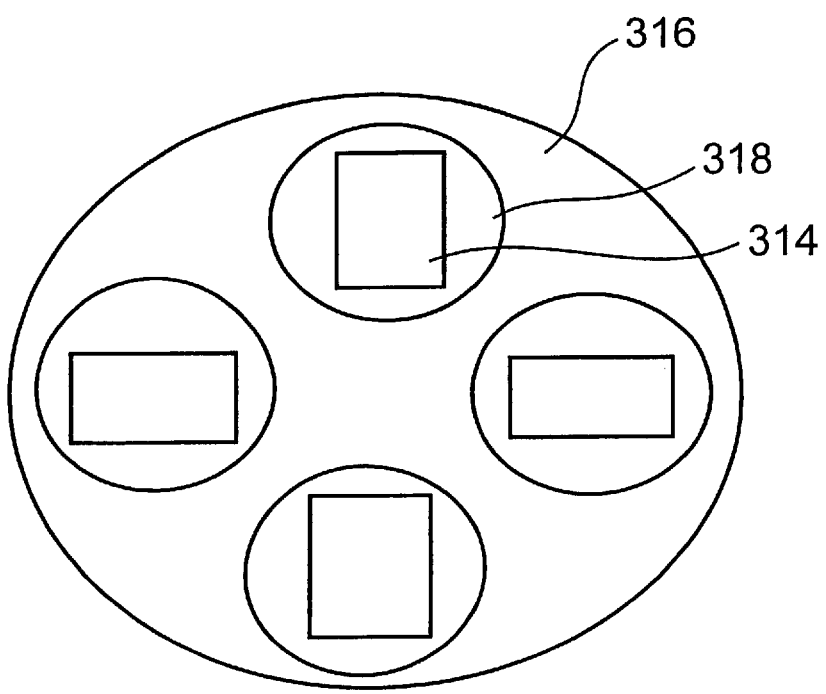
FIG. 9: a conceptual view illustrating the relation between a subsidiary carrier and a carrier according to Embodiment 3.

Further, by attaching a circular subsidiary carrier 318 capable of holding a rectangle base 314, instead of the above circular base, to a carrier 316 which is an original work holder as shown in FIG. 9, the same effect as polishing of a circular base can be obtained.

By this method, the portion to be cut at the periphery of the base can be decreased or unnecessary, and the loss of the material can be minimized. The circular subsidiary carrier 318 may have the same functions as the dummy portion to be processed 315 by selecting the same thickness and material as the dummy portion to be processed 315.

Now, specific Examples of Embodiment 3 will be explained. An ingot of a synthetic quartz material synthesized by the above-described method, having a desired thickness, and transmitting at least 85% of light having a predetermined wavelength, was cut into 152 mm×152 mm×2.3 mm thickness by an inner blade slicer, followed by chamfering by means of a commercially available NC chamfering machine so that the outline dimension was 122 mm×149 mm, and the edge face had an R-shape.

Then, in order to suppress progress of cracks due to cutting and cracks due to chamfering, this synthetic quartz glass sheet was soaked in a 5% HF solution as represented by mass percentage. Then, this synthetic quartz glass sheet was subjected to lapping by means of 16B double surface lapping machine manufutured by Speed Fam using, as an abrasive material, a slurry having from 10 to 12% as represented by mass percentage of FO#1200 (tradename, manufactured by FUJIMI CORPORATION) suspended in filtrate, until the thickness became 0.35 mm.

Then, the same etching treatment as described above was applied to the synthetic quartz glass sheet after lapping. Subsequently, this synthetic quartz glass sheet was polished by a slurry consisting essentially of cerium oxide and a polyurethane pad by using 16B double surface polishing machine manufactured by Speed Fam, and then subjected to finish polishing by a slurry consisting essentially of cerium oxide and a foamed polyurethane pad by using the same machine, to obtain a pellicle sheet having a thickness of 305 $\mu$m of the present invention.

Figure 10:
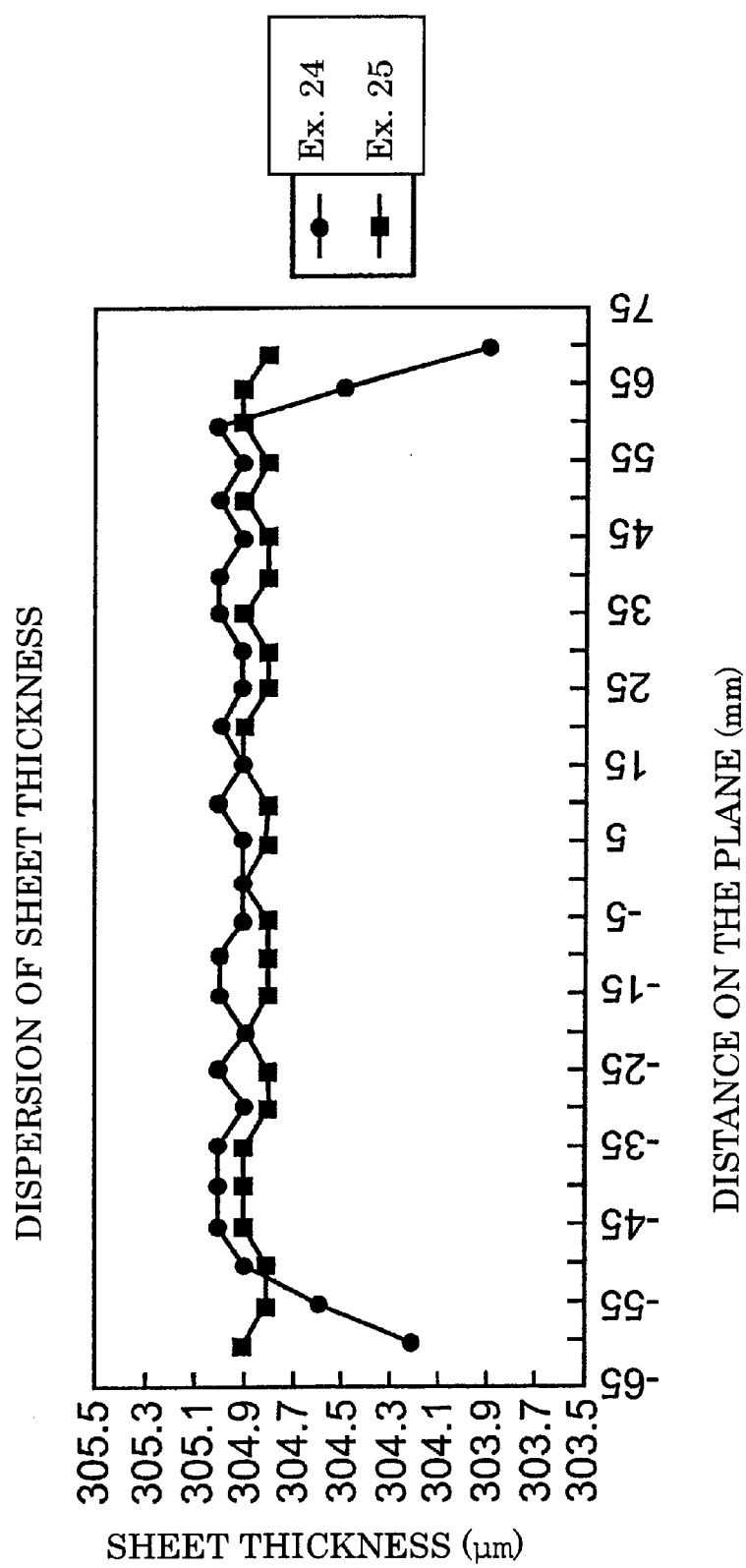
FIG. 10: a graph illustrating measurement results of dispersion of sheet thickness in Examples according to Embodiment 3.

This pellicle sheet was measured by a thickness measuring apparatus utilizing laser light (laser focus displacement gage manufactured by Keyence Corporation), and the results are shown in FIG. 10. As evident from FIG. 10, although the periphery of the sheet is thin, the dispersion of sheet thickness excluding an area within 5 mm from the periphery is small (Example 24). From the results, a base preliminarily having a dimension of 132 mm×159 mm was processed by the above-described step, and the periphery was cut to obtain a pellicle sheet of 122 mm×149 mm, whereupon the dispersion of sheet thickness can be suppressed to be within ±0.3 $\mu$m/150 mm within a range of 122 mm×149 mm (Example 25). Namely, by employing the method of Embodiment 3, a pellicle sheet having a dispersion of sheet thickness within ±0.3 $\mu$mm/150 mm can be obtained.

Here, the apparatus, the abrasive material and the abrasive cloth are not limited to those used in the above Examples, and their types are not limited so long as the same properties are obtained and the object can be achieved.

Now, an embodiment (Embodiment 4) to overcome the fourth problems will be explained below.

According to Embodiment 4, a pellicle comprising a pellicle frame and a pellicle sheet attached to the upside of the pellicle frame, wherein the pellicle sheet is made of a synthetic quartz glass, and chamfering applied to the periphery, is provided.

The pellicle sheet according to Embodiment 4 preferably has a transmittance at a wavelength of ultraviolet light with which the pellicle is irradiated, of preferably at least 85% as actual thickness of the pellicle sheet. The thickness of the pellicle sheet is preferably from 10 to 2000 $\mu$m, particularly preferably from 10 to 1000 $\mu$m.

Further, the periphery of the pellicle sheet is chamfered. The chamfering can be carried out by one of R-chamfering, mirror chamfering and etching, or a combination thereof. By the chamfering, mechanical strength of the pellicle sheet can be improved, breakage such as fracture or chipping during processing or during its use can be decreased, and generation of fine cullet from the periphery can be suppressed. Further, by mirror chamfering or by etching, it is possible to prevent dusts of e.g. the abrasive material from remaining on the surface. In this manner, generation of scars during polishing step due to cullet or dusts can be decreased, and stain on the surface of the pellicle during pellicle assembling or after mounting of the pellicle can be decreased.

Figure 11:
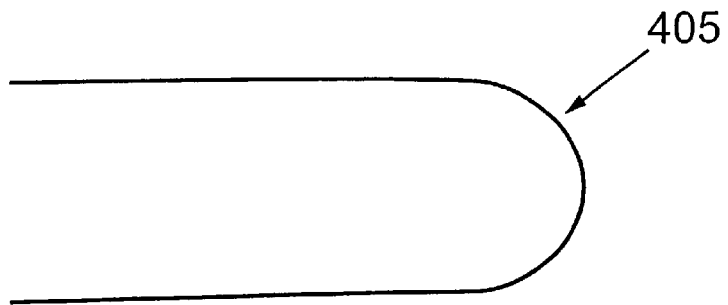
FIG. 11: a partial side view illustrating one example of a pellicle sheet according to Embodiment 4.
Figure 12:
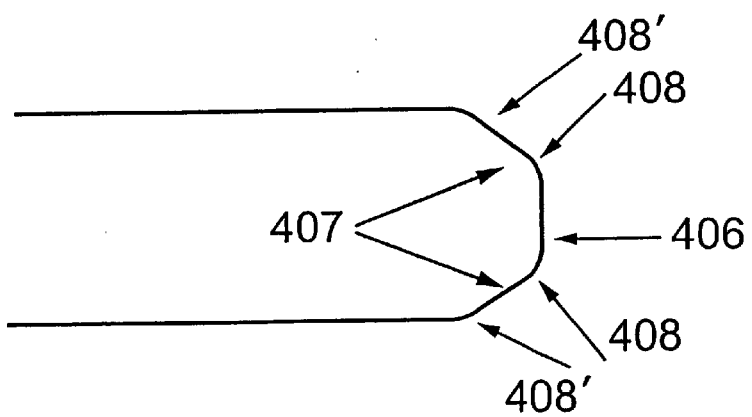
FIG. 12: a partial side view illustrating another example of a pellicle sheet according to Embodiment 4.

As the R shape in the case of R-chamfering, it is preferred to form R-chamfered portion 405 so that the entire edge face has an R shape, as illustrated in a pellicle sheet partial side view of FIG. 11, in order to let impact from the outside out as far as possible. However, the same effect may be obtained when the edge 408 at the boundary of a slanting chamfered face 407 and an edge face 406 and the edge 408' at the boundary of the slanting chamfered face 407 and the surface 409 have an R shape, as illustrated in a pellicle sheet partial side view of FIG. 12.

R shape may be formed mechanically by giving R shape to a diamond wheel when the chamfering is applied, or may be formed by adjusting processing conditions such as adjustment of the length of bristles of a brush or a buff during mirror processing as mentioned hereinafter.

Further, since an etching treatment is carried out later, the edge between the edge face and the chamfered portion of the pellicle sheet will be smooth even with C-chamfering, and it may be substituted for R-chamfering.

In the case of polishing the surface, the mirror chamfering is carried out preferably before the polishing step, and a known method such as brush polishing or buff polishing may be employed, but the smoothness or the face is preferably at most 5 nm.

Further, the etching processing at the periphery may be carried out by using a chemical capable of adequately eroding a synthetic quartz glass, such as HF, $HF+H_2SO_4$ or NaOH, but an etching amount of from 0.01 to 10 $\mu$m will be required to suppress progress of cracks generated due to e.g. chamfering.

Figure 13:
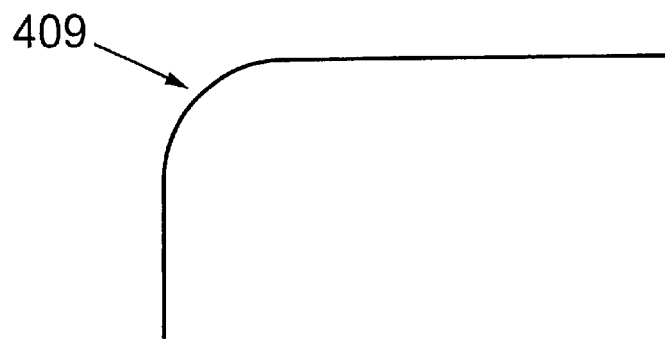
FIG. 13: a partial front view illustrating one example of a pellicle sheet according to Embodiment 4.
Figure 14:
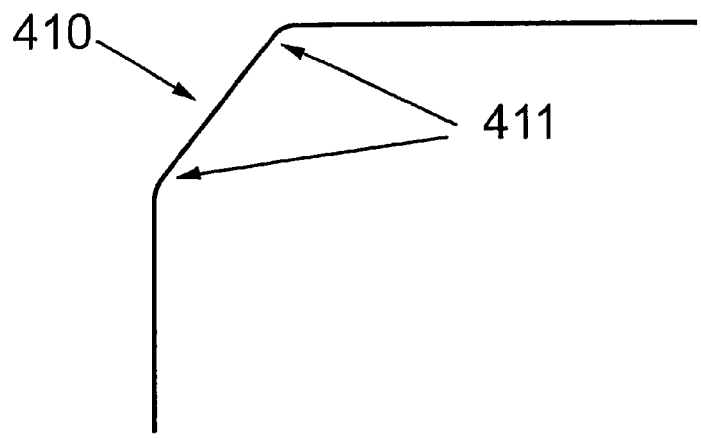
FIG. 14: a partial front view illustrating another example of a pellicle sheet according to Embodiment 4.

Further, according to Embodiment 4, the pellicle sheet preferably has a rounded shape at the corner portions. Namely, as illustrated in a pellicle sheet partial front view of FIG. 13, mechanical strength can be improved by making the corner portion 409 between adjacent sides of the pellicle sheet have an R shape. The size of the R shape is not particularly limited, but it is suitably within a range of not extending beyond the pellicle frame.

Further, the entire corner portion has to have an R shape, and the same effects can be obtained when the both ends of the corner cut portion 410, i.e. portions 411 which are in contact with the sides, have an R shape, as illustrated in a pellicle sheet partial front view.

In Embodiment 4, it is preferred to apply optical polishing to the surface of the pellicle sheet. As a method of optical polishing, a known double surface polishing apparatus or single surface polishing apparatus may be used, but the surface roughness after polishing is preferably at most 5 nm as $R_{ms}$, and the degree of parallelization is preferably at most 25 nm.

Particularly when single surface polishing is employed, one having a face of a work holder which holds the pellicle sheet or to which the pellicle sheet is bonded, polished into optical flat, is used to maintain the degree of parallelization of the pellicle sheet.

The roughness of the pellicle sheet-holding face of the work holder may be either mirror face or lapped face, but is preferably lapped face so that dust attached to the face or the foreign substances in the adhesive material will not be obstacle. The material of the work holder may be any of metals, ceramics and glass, and one which is less likely to be influenced by thermal expansion due to heat generation during processing may be selected.

Figure 16:
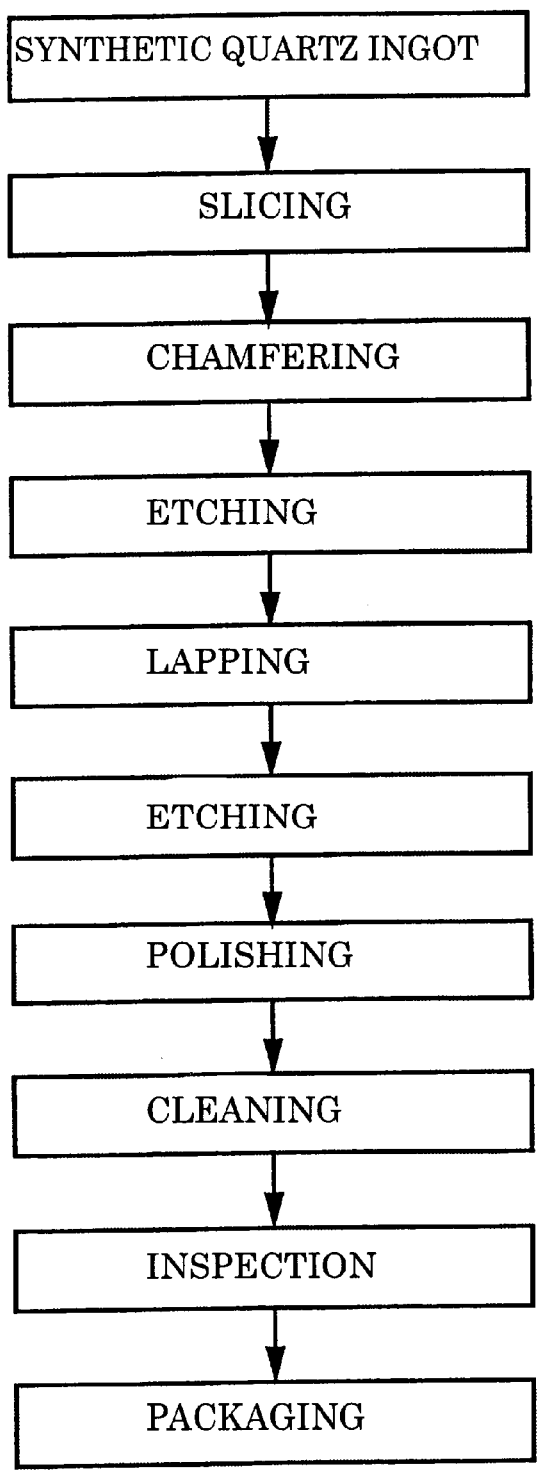
FIG. 16: a flowchart illustrating one example of a production process of a pellicle sheet according to Embodiment 4.

FIG. 16 is a flowchart illustrating a typical production process of the pellicle sheet according to Embodiment 4. Here, the lapping step may be carried out in multi-stages or the polishing step may be carried out in multi-stages with a purpose of improving processing accuracy and saving time.

Further, presence of Griffith-Flaws or scars on the surface of the pellicle sheet decreases mechanical strength, and accordingly it is preferred to apply etching to the surface after the polishing or before and after the polishing to prevent breakage. As a method of etching the surface, it is preferred to use a chemical having a great etching effect to the synthetic quartz glass, such as HF, HF+$H_2SO_4$ or NaOH, to diminish the load during the step. However, on the other hand, considering that the pellicle sheet is very thin, and that scars on the surface may be manifested by etching and may be an obstacle to the exposure, it is preferred to use a chemical having a relatively low etching property, such as $HNO_3$ or $HNO_3$+$H_2SO_4$. The etching amount is preferably at a level of from 0.01 to 1.0 μm and within a range of not impairing the smoothness of the surface.

It is preferred to carry out the etching step before and after lapping and polishing, and after each stage of lapping and polishing in the case of multiple-stages, however, as shown in FIG. 16, etching step may be carried out before or after overall lapping and polishing steps.

Further, after polishing, an independent step as an etching step may be carried out, or the etching may be carried out as one step in a cleaning step to obtain both effect of cleaning and etching.

It is preferred to form an antireflection film against mainly exposure wavelength on both sides or one side of the pellicle sheet obtained by the above steps. As the type of the antireflection film, known $MgF_2$, $Al_2O_3$, $ZrO_2$, $CaF_2$ or the like may be used, and a single-layer or a multi-layer structure may be employed with a thickness and a combination which makes the reflectance minimum. Further, formation of the antireflection film may be carried out by a known vapor deposition method or sputtering method.

Figure 15:
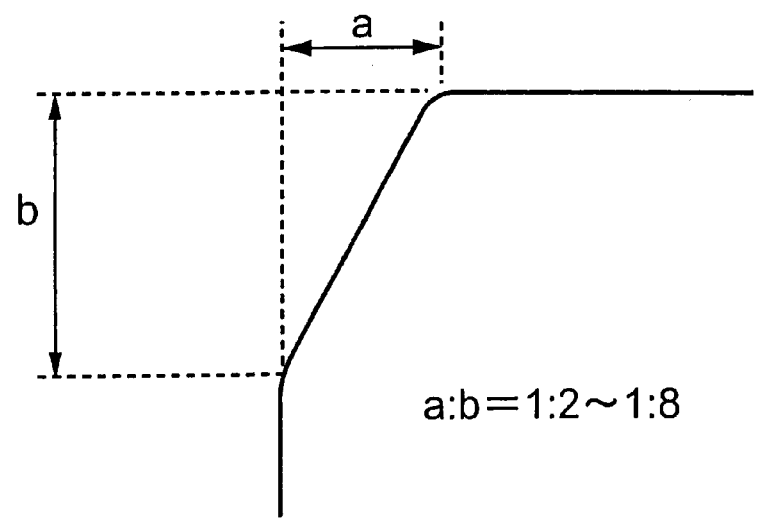
FIG. 15: a partial front view illustrating another example of a pellicle sheet according to Embodiment 4.

Further, in a case where constitution of the film is different as between the front and the back, or depending upon the presence or absence of the film, it is necessary to distinguish the faces of the pellicle sheet, and accordingly it is preferred to provide a corner cut having a proportion of the short side a and the long side b of cut portion of from 1:2 to 1:8, on at least one corner, or at plural corner portions as the case requires, made by two sides of the rectangular pellicle sheet, as illustrated in a pellicle sheet partial front view of FIG. 15. In this case, the boundary between the sides of the rectangle at the cut portion preferably has an R-shape from the above reasons.

Now, Examples of the present Embodiment will be explained below.

Ingot of a synthetic quartz glass material synthesized by the above-described method, having a predetermined thickness, and transmitting at least 85% of a predetermined wavelength, was cut by an inner blade slicer into 125 mm×125 mm×2.3 mm thickness, and chamfering was carried out by a commercially available NC chamfering machine so that the edge face had an R-shape.

Then, it was soaked in 5 wt % HF aqueous solution so as to suppress progress of cracks due to cutting and cracks due to chamfering.

Then, this synthetic quartz glass sheet was subjected to lapping by means of 16B double surface lapping machine manufactured by Speed Fam by using, as an abrasive material, a slurry having from 10 to 12 wt % of FO#1200 (tradename, manufactured by FUJIMI CORPORATION) suspended in filtrate, until the thickness became 0.35 mm.

Then, the same etching treatment as described above was applied to the synthetic quartz glass sheet after lapping.

Subsequently, this synthetic quartz glass sheet was polished using a slurry consisting essentially of cerium oxide and a polyurethane pad by using 16B double surface polishing machine manufactured by Speed Fam, and then subjected to finish polishing using a slurry consisting essentially of cerium oxide and a foamed polyurethane pad by using the same machine, to obtain a synthetic quartz glass sheet having no scar on the surface and a good thickness of 250 μm.

This synthetic quartz glass sheet had adequate properties and strength as a pellicle sheet, and was suitable as a pellicle sheet for $F_2$ laser and ArF excimer laser.

Here, the apparatus, the abrasive material and the abrasive cloth are not limited to those used in the above Examples, and their types are not limited so long as the same properties are obtained and the object can be achieved.

INDUSTRIAL APPLICABILITY

According to the present invention, a pellicle sheet which has an excellent light transmittance at a wavelength of from 150 to 200 nm, which has a high durability and of which the light transmittance does not decrease even when irradiated with ultraviolet light in said wavelength region, can be obtained.

Further, according to Embodiment 2 of the present invention, a pellicle using a synthetic quartz glass pellicle sheet which can adequately suppress generation of cullet when the pellicle is used, can be obtained.

Further, according to Embodiment 3 of the present invention, a pellicle equipped with a synthetic quartz glass pellicle sheet having a degree of accuracy with a dispersion of the thickness within ±0.3 μm/150 mm, can be obtained.

Still further, according to Embodiment 4 of the present invention, a drawback of a synthetic quartz glass that it has a high hardness as a material but is fragile can be overcome, and a pellicle equipped with a thinner pellicle sheet can be obtained at a low cost, and further, there is an effect of suppressing drawbacks to be obstacle to exposure, such as scars and scratches.

What is claimed is:

1. A pellicle which comprises a pellicle frame and a pellicle sheet made of a synthetic quartz glass, attached to an opening of the pellicle frame, wherein the pellicle sheet is made of a synthetic quartz glass having a OH group concentration of at most 100 ppm and containing substantially no oxygen deficient defect.

2. The pellicle according to claim 1, Wherein the pellicle sheet is made of a synthetic quartz glass having a OH group concentration of at most 10 ppm, containing substantially no oxygen deficient defect and having an internal transmittance of at least 80%/cm at a wavelength of 157 nm.

3. The pellicle according to claim 1, wherein the pellicle sheet has a centerline average surface roughness $R_a$ of at most 0.5 μm on the side face in an area within 10 μm from the surface.

4. The pellicle according to claim 3, wherein the pellicle sheet has a thickness of at most 0.5 mm.

5. The pellicle according to claim 1, wherein the dispersion of the sheet thickness of the pellicle sheet is within ±0.3 μm/150 mm.

6. The pellicle according to claim 1, wherein the pellicle sheet has chamfering applied at the periphery.

7. The pellicle according to claim 1, wherein the pellicle sheet has a rounded shape at the corner portions.

8. The pellicle according to claim 1, wherein the pellicle sheet is attached to the pellicle frame so that the outline of the pellicle frame extends beyond the outline of the pellicle sheet, and the width of the extension is from 0.05 to 1 mm.

9. A method for producing the pellicle according to claim 1, which comprises:

a step of polishing a synthetic quartz glass sheet having an outline dimension larger than the dimension of the pellicle frame by at least 5 mm, and cutting the synthetic quartz glass sheet into a predetermined dimension to produce the pellicle sheet.

10. A method for producing the pellicle according to claim 1, which comprises:

a step of polishing a synthetic quartz glass sheet in such a state that a dummy portion to be processed is attached to the periphery of the synthetic quartz glass sheet to produce the pellicle sheet.

11. The pellicle according to claim 1, wherein said synthetic quartz glass has a chlorine concentration of at most 100 ppm.

12. The pellicle according to claim 11, wherein said synthetic quartz glass has a chlorine concentration of at most 10 ppm.

13. The pellicle according to claim 12, wherein said synthetic quartz glass has a chlorine concentration of at most 2 ppm.

14. The pellicle according to claim 1, wherein said synthetic quartz glass has a total metal impurity content of at most 100 ppb.

15. The pellicle according to claim 1, wherein said synthetic quartz glass has a total metal impurity content of at most 10 ppb.

* * * * *